United States Patent
Koyama

(10) Patent No.: US 6,636,079 B2
(45) Date of Patent: Oct. 21, 2003

(54) PHASE COMPARING CIRCUIT, PLL CIRCUIT, TELEVISIONS BROADCASTING RECEIVER, AND METHOD OF COMPARING PHASE

(75) Inventor: Takeshi Koyama, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/782,021

(22) Filed: Feb. 14, 2001

(65) Prior Publication Data

US 2001/0013798 A1 Aug. 16, 2001

(30) Foreign Application Priority Data

Feb. 16, 2001 (JP) ........................................ 2000-038589

(51) Int. Cl.$^7$ .............................................. G01R 25/00
(52) U.S. Cl. ............................. 327/7; 327/42; 327/148; 327/157
(58) Field of Search ................................. 327/2, 3, 5, 6, 327/7, 12, 147, 148, 149, 156, 157, 158, 39–43; 331/25; 375/374–376

(56) References Cited

U.S. PATENT DOCUMENTS

| | | | | |
|---|---|---|---|---|
| 4,322,643 A | * | 3/1982 | Preslar ........................... 327/5 |
| 4,636,748 A | * | 1/1987 | Latham, II ................... 331/17 |
| 5,103,191 A | * | 4/1992 | Werker ........................ 331/1 A |
| 5,365,121 A | * | 11/1994 | Morton et al. ............... 327/170 |
| 5,422,604 A | * | 6/1995 | Jokura ........................... 331/2 |
| 5,459,755 A | * | 10/1995 | Iga et al. ..................... 375/376 |
| 5,598,405 A | * | 1/1997 | Hirose ........................ 370/280 |
| 5,633,766 A | * | 5/1997 | Hase et al. .................... 360/51 |
| 5,646,563 A | * | 7/1997 | Kuo ............................ 327/157 |
| 5,694,062 A | * | 12/1997 | Welch et al. ................... 327/3 |
| 5,892,380 A | * | 4/1999 | Quist .......................... 327/172 |
| 5,929,677 A | * | 7/1999 | Murata ....................... 327/157 |
| 6,058,152 A | * | 5/2000 | Tanishima ................... 375/376 |
| 6,111,470 A | * | 8/2000 | Dufour ......................... 331/17 |
| 6,141,163 A | * | 10/2000 | Nakamura et al. ............ 360/51 |
| 6,150,889 A | * | 11/2000 | Gulliver et al. .............. 331/14 |
| 6,157,218 A | * | 12/2000 | Chen ............................. 327/7 |
| 6,192,094 B1 | * | 2/2001 | Herrmann et al. .......... 375/375 |
| 6,195,563 B1 | * | 2/2001 | Samuels ..................... 455/553 |
| 6,433,596 B1 | * | 8/2002 | Bossard ...................... 327/157 |
| 6,480,070 B2 | * | 11/2002 | Locher ......................... 331/17 |

* cited by examiner

Primary Examiner—Timothy P. Callahan
Assistant Examiner—Hai L. Nguyen
(74) Attorney, Agent, or Firm—Oblon, Spivak, McClelland, Maier & Neustadt, P.C.

(57) ABSTRACT

An object of the present invention is to provide a phase comparing circuit capable of outputting a signal in accordance with phase difference with a high degree of accuracy, even if the phase difference is small. The phase comparing circuit according to the present invention has a feed forward circuit connected between a frequency phase comparator and a charge pump. The feed forward circuit has a capacitor connected between each Q output terminal of flip-flops in the frequency phase comparator and the current path of the charge pump circuit. The capacitor couples capacitively the Q output terminals of the D flip-flops with the current path of the charge pump circuit, in order to quickly provide the Q output voltages of the D flip-flops to the charge pump circuit. Accordingly, even when the phase difference of the input signals FS and FR is small, the voltage in accordance with the phase difference is provided to a collector terminal of a transistor in the charge pump circuit, thereby controlling the current passing through the charge pump circuit with a high degree of accuracy in accordance with the phase difference.

19 Claims, 5 Drawing Sheets

PHASE COMPARING CIRCUIT, PLL CIRCUIT, TELEVISIONS BROADCASTING RECEIVER, AND METHOD OF COMPARING PHASE

CROSS REFERENCE TO RELATED APPLICATIONS

The subject application is related to subject matter disclosed in Japanese Patent Application No. 2000-38589 filed on Feb. 16, 2000 in Japan to which the subject application claims priority under Paris Convention and which is incorporated herein by reference.

BACKGROUND OF THE INVENTION

1. Field of the Invention

The present invention relates to a phase comparing circuit for detecting phase difference of two types of input signals. A phase comparing circuit used for various circuits constituted by a PLL (Phase Locked Loop), for example, a front-end processor for digital broadcasting is a subject of the present invention.

2. Related Background Art

A phase comparing circuit, which compares phases of two types of input signals FS and FR, and outputs a signal in accordance with phase difference of both signals, is proposed. FIG. 1 is a block diagram showing schematic configuration of a conventional phase comparing circuit. The phase comparing circuit of FIG. 1 is used, for example, in the PLL circuit, and is provided with a frequency phase comparator 1, a charge pump circuit 2, and a current-voltage converting circuit 3. The signal outputted from an output terminal of the frequency phase comparator 1 is inputted to the charge pump circuit 2 and a signal in accordance with the phase difference is generated. The current-voltage conversion circuit 3 outputs a voltage in accordance with the phase difference.

In the circuit of FIG. 1, when the phase of the signal FS gets ahead of that of the signal FR, the output OUT1 of the frequency phase comparator 1 outputs a pulse in accordance with the phase difference, and the output OUT2 does not output any pulse. At this time, the output terminal OUT3 of the phase comparing circuit outputs a positive pulse signal. Conversely, when the phase of the signal FS gets behind that of the signal FR, the output terminal OUT3 of the phase comparing circuit outputs a negative pulse signal.

FIG. 2 is a signal waveform diagram showing the input signals FS and FR, the output of the frequency phase comparator 1, and the output of the phase comparing circuit. FIG. 2A shows an example in which the phase difference of the input signals FS and FR is large, and FIG. 2B shows an example in which the phase difference is small.

When the phase difference is large, the voltage in accordance with the phase difference is outputted from the phase comparing circuit. When the phase difference is small, no matter how quickly the frequency phase comparator 1 and the charge pump circuit 2 operate, the phase comparing circuit cannot output the pulse signal in accordance with the phase difference due to the circuit delay.

The dotted line L2 of FIG. 3 is a diagram showing the phase difference of the phase comparing circuit of FIG. 1 and the output voltage. The smaller the phase difference of the input signals FS and FR of the frequency phase comparator 1 becomes, the worse the sensitivity of the output voltage for the phase difference gets. A region showing by an arrow of FIG. 3 is called a Dead Zone in which there is little sensitivity of the output voltage for the phase difference.

If the PLL circuit is constituted by using the phase comparing circuit having such a Dead Zone, a loop gain of the PLL circuit significantly becomes lower. Especially, a clean-up performance of the oscillator at lower frequency band becomes lower; as a result, it becomes impossible to normally perform PLL control. Here, the clean-up performance is a performance to reduce a jitter component.

Especially, in case of the digital broadcasting, phase noise performance of the oscillator is a factor to determine the performance of the system. When the system is constituted by using the phase comparing circuit having the Dead Zone such as the conventional example, it is impossible to improve the phase noise performance.

SUMMARY OF THE INVENTION

An object of the present invention is to provide a phase comparing circuit, a PLL circuit, a television broadcasting receiver and a method of comparing phase capable of outputting a signal in accordance with the phase difference with a high degree of accuracy, even if the phase difference is small.

In order to achieve the foregoing object, a phase comparing circuit, comprising:

a phase comparator configured to detect phase difference between first and second input signals;

a charge pump circuit configured to output a signal in accordance with said detected phase difference; and a feed forward circuit connected between said phase comparator and a signal transmission path in said charge pump circuit, said feed forward circuit being configured to provide a signal in accordance with said phase difference to said charge pump circuit.

According to the present invention, the feed forward circuit is connected between the output terminal of the phase comparator and the signal transmission path in the charge pump circuit, and the voltage signal in accordance with the phase difference is directly provided to the charge pump circuit. Because of this, even if the phase difference is small, a large Dead Zone does not exist, thereby surely outputting the signal in accordance with the phase difference. Therefore, when the phase comparator of the present invention is applied to the PLL circuit, it is possible to generate a stable and high-precision oscillating signal that a jitter component is small. Especially, when the present invention is applied to the front-end processor for the digital broadcasting, it is possible to drastically improve performance of the front-end processor.

Furthermore, a PLL circuit, comprising:

a phase comparing circuit including a phase comparator configured to detect phase difference between first and second input signals, a charge pump circuit configured to output a signal in accordance with said detected phase difference, and a feed forward circuit connected between said phase comparator and a signal transmission path in said charge pump circuit, said feed forward circuit being configured to provide a signal in accordance with said phase difference to said charge pump circuit;

a voltage control oscillator configured to control oscillating frequency based on the output of said phase comparing circuit; and a divider configured to provide a signal obtained by dividing the output frequency of said voltage control oscillator to said phase comparing circuit.

Furthermore, a television broadcasting receiver, comprising:

a bandpass filter configured to filter a signal received at an antenna;

a PLL circuit according to claim 10 configured to generate a local oscillating signal;

a mixer configured to convert a signal passing through said bandpass filter by using said local oscillating signal;

a base band processor configured to perform signal processing for the frequency-converted signal; and a control circuit configured to control channel switching.

Furthermore, a method of comparing phases provides a voltage signal in accordance with phase difference to a charge pump circuit, based on capacity coupling between a node in a phase comparator configured to detect the phase difference of first and second input signals and a signal transmission path in said charge pump circuit configured to output a signal in accordance with said phase difference.

DESCRIPTION OF THE PREFERRED EMBODIMENTS

A phase comparing circuit, a PLL circuit, a television broadcasting receiver, and a method of comparing phase according to the present invention will now be concretely described hereinafter with reference to the accompanying drawings.

First Embodiment

Figure 1:
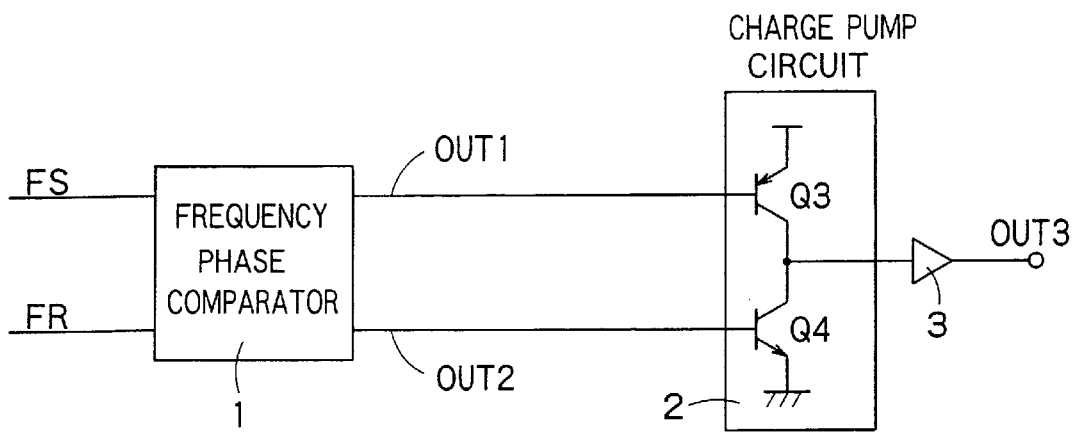
FIG. 1 is a block diagram showing schematic diagram of a conventional phase comparing circuit.
Figure 2A:
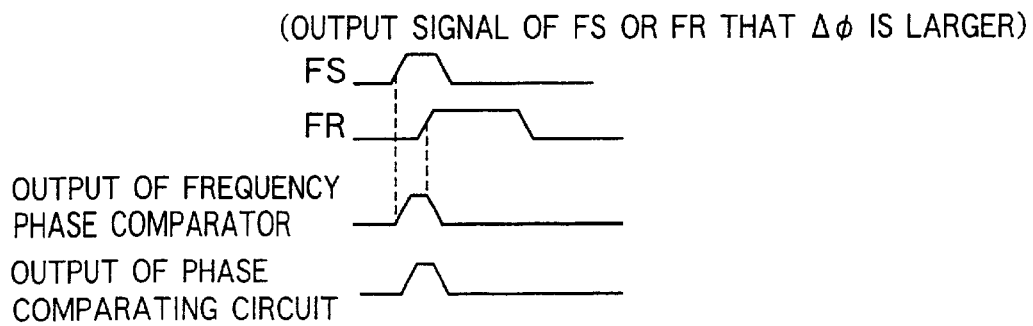
FIG. 2A is a signal waveform diagram in case that the phase difference between the input signals FR and FS is large.
Figure 2B:
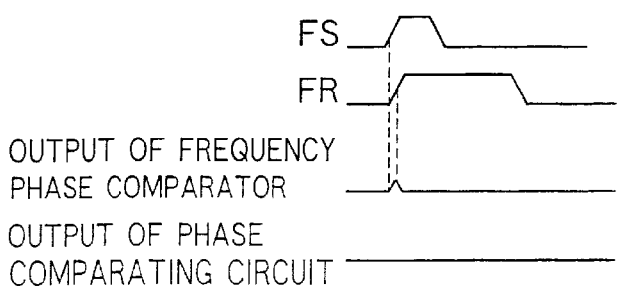
FIG. 2B is a signal waveform diagram in case that the phase difference between the input signals is small.
Figure 4:
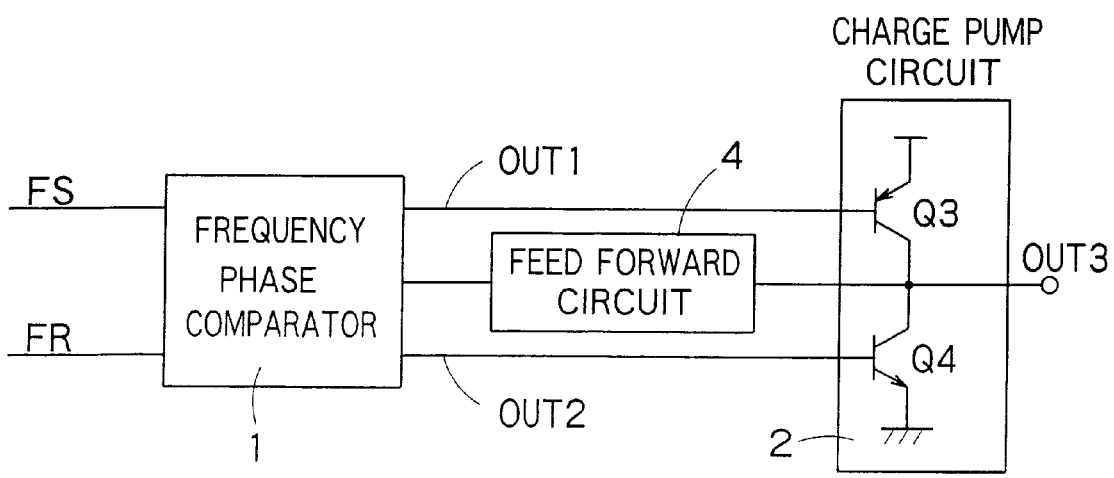
FIG. 4 is a block diagram of a first embodiment of the phase comparing circuit according to the present invention.

FIG. 4 is a block diagram of a first embodiment of a phase comparing circuit according to the present invention. The phase comparing circuit of FIG. 4 has a feature in which a feed forward circuit is provided to a subsequent stage of the frequency phase comparator 1 configured in the same way as FIG. 1. The output signal of the frequency phase comparator 1 is inputted to the feed forward circuit 4 and also to a charge pump circuit 2.

Figure 5:
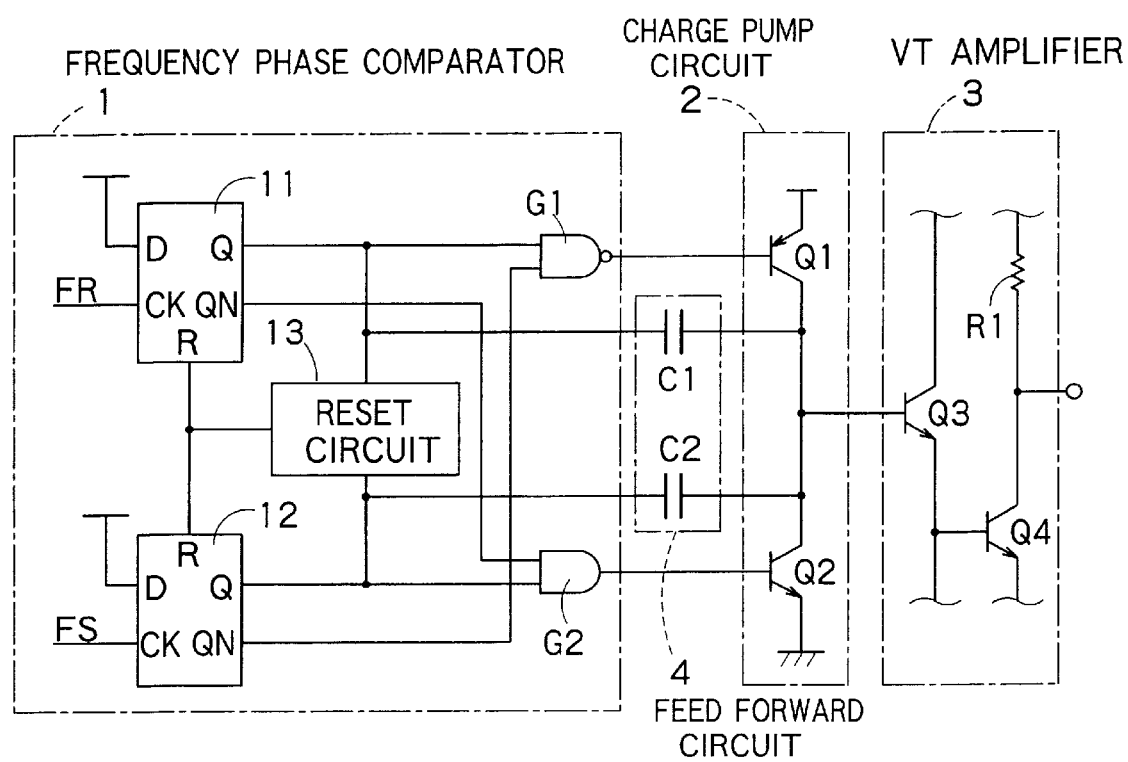
FIG. 5 is a circuit diagram showing detailed configuration of the phase comparing circuit shown in FIG. 4.

FIG. 5 is a circuit diagram showing detailed configuration of the phase comparing circuit of FIG. 4. The phase comparing circuit of FIG. 4 and FIG. 5 has a frequency phase comparator 1 with the same configuration as the conventional comparator, a charge pump circuit 2, and a current-voltage converting circuit 3, and further it has a feed forward circuit 4.

The frequency phase comparator 1 has a D flip-flop (a first flip-flop) 11, a D flip-flop (a second flip-flop) 12, a reset circuit 13, a NAND gate (a first logic circuit) G1, and an AND gate (a second logic circuit) G2. The feed forward circuit 4 has two capacitors (first and second capacitors) C1 and C2 connected to Q output terminals of the D flip-flops 11 and 12, respectively.

The input signals FR and FS are inputted to the clock terminals of the D flip-flops 11 and 12. The Q output of the D flip-flop 11 and the QN output of the D flip-flop 12 are inputted to the NAND gate G1. The QN output of the D flip-flop 11 and the Q output of the D flip-flop 12 are inputted to the AND gate G2. The outputs of these NAND gate G1 and the AND gate are inputted to the charge pump circuit 2. The reset circuit 13 resets the flip-flops 11 and 12 at each timing for carrying out the phase comparison.

The charge pump circuit 2 has two transistors Q1 and Q2 connected in series. The output terminal of the NAND gate G1 is connected to the base terminal of the transistor (PNP transistor) Q1, and the output terminal of the AND gate G2 is connected to the base terminal of the transistor (NPN transistor) Q2. Current passing through a collector and an emitter of the transistors Q1 and Q2 corresponds to a signal transferring path of the charge pump circuit 2.

The capacitor C1 in the feed forward circuit 4 is connected between the Q output of the D flip-flop 11 and the collector terminal of the transistor Q1 in the charge pump circuit 2, and the capacitor C2 is connected between the Q output of the D flip-flop 12 and the collector terminal of the transistor Q2 in the charge pump circuit 2.

The current-voltage converting circuit 3 has a plurality of transistors Q3 and Q4 connected in a form of a Darlington circuit and a resistor R1, and converts the current passing through the charge pump circuit 2 into a voltage.

Although the D flip-flops 11 and 12 of FIG. 5 invert at rising edges of the input signals FR and FS, they may invert at falling edge of the input signals FR and FS.

Next, the operation of the phase comparing circuit of FIG. 4 and FIG. 5 will be explained. The feed forward circuit 4 constituted by the capacitors C1 and C2 provides the Q output voltage of the D flip-flops 11 and 12 directly to the charge pump circuit 2 without passing through the NAND gate G1 and the AND gate G2. That is, the capacitors C1 and C2 capacitively couple the Q output terminals of the D flip-flops 11 and 12 with a signal transmission path of the charge pump 2, in order to quickly provide the Q output voltage of the D flip-flops 11 and 12 to the charge pump circuit 2.

Accordingly, even if the phase difference between the input signals FS and FR is small, because the voltage in accordance with the phase difference is provided to the collector terminals of the transistors Q1 and Q2 in the charge pump circuit 2, it is possible to control the current passing through the charge pump circuit 2 in accordance with the phase difference with a high degree of accuracy.

Furthermore, because the phase comparing circuit according to the present embodiment transmits the phase difference signal by capacity coupling, the circuit functions as a low frequency suppression circuit, and transfers only the rising edge or the falling edge of the pulse signals by capacity coupling. That is, when the phase difference of the input signals FS and FR is large, the circuit of FIG. 4 acts in the same way as that of FIG. 1, and the affect by connection of the feed forward circuit 4 is ignored. Accordingly, when the phase difference is large, the performance similar to the conventional circuit is obtained.

Thus, because the present embodiment is constituted by a simplified circuit of adding only the capacitors C1 and C2 to the conventional circuit, while the change of circuit design is simplified, it is possible to improve the performance in case that the phase difference is small, and integration of the circuit is also simplified.

Figure 3:
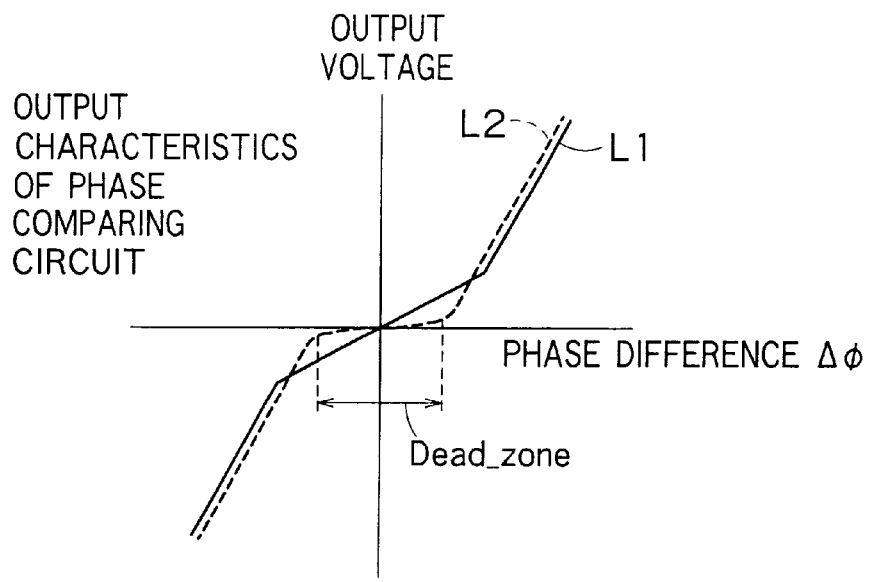
FIG. 3 is an output characteristic diagram of the phase comparing circuit of FIG. 1 and FIG. 4.

FIG. 3 is an output characteristic diagram of the phase comparing diagram of FIG. 4 and FIG. 5, and a horizontal axis of FIG. 3 expresses the phase difference $\Delta\phi$, and a vertical axis expresses the output voltage. A solid line L1 of FIG. 3 shows output characteristics of the phase comparing circuit, and a dotted line L2 shows output characteristics of the phase comparing circuit.

As shown in the solid line L1 of FIG. 3, by providing the feed forward circuit 4 constituted of the capacitors C1 and C2, it is possible to output the output voltage in accordance with the phase difference $\Delta\phi$ even in a region in which the phase difference is small and which was the Dead Zone in the conventional circuit.

Figure 6:
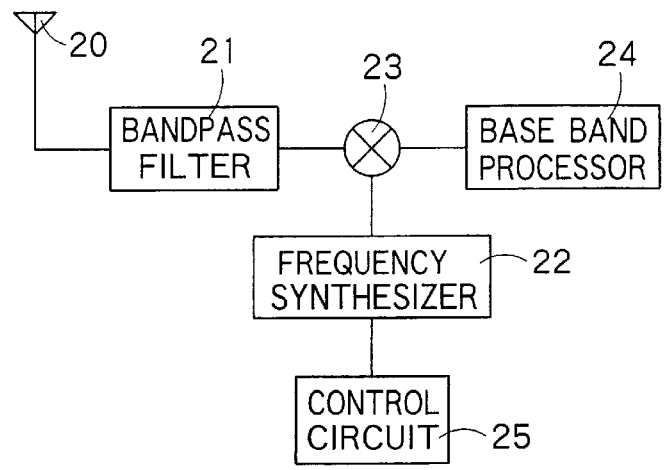
FIG. 6 is a block diagram showing schematic configuration of a television broadcasting receiver.

Incidentally, the phase comparing circuit of FIG. 4 and FIG. 5 is used, for example, by a frequency synthesizer in a television broadcasting receiver. FIG. 6 is a block diagram showing schematic configuration. The television broadcasting receiver of FIG. 6 has a bandpass filter 21 for filtering the signal received by the antenna 20, a frequency synthesizer 22 for generating a local oscillating signal, a mixer 23 for converting the frequency of the signal passing through the bandpass filter 21 by using the local oscillating signal, a base band processor 24 for performing signal processing for the signal after converting the frequency, and a control circuit 25 for selecting divided ratio of an after-mentioned divider.

Figure 7:
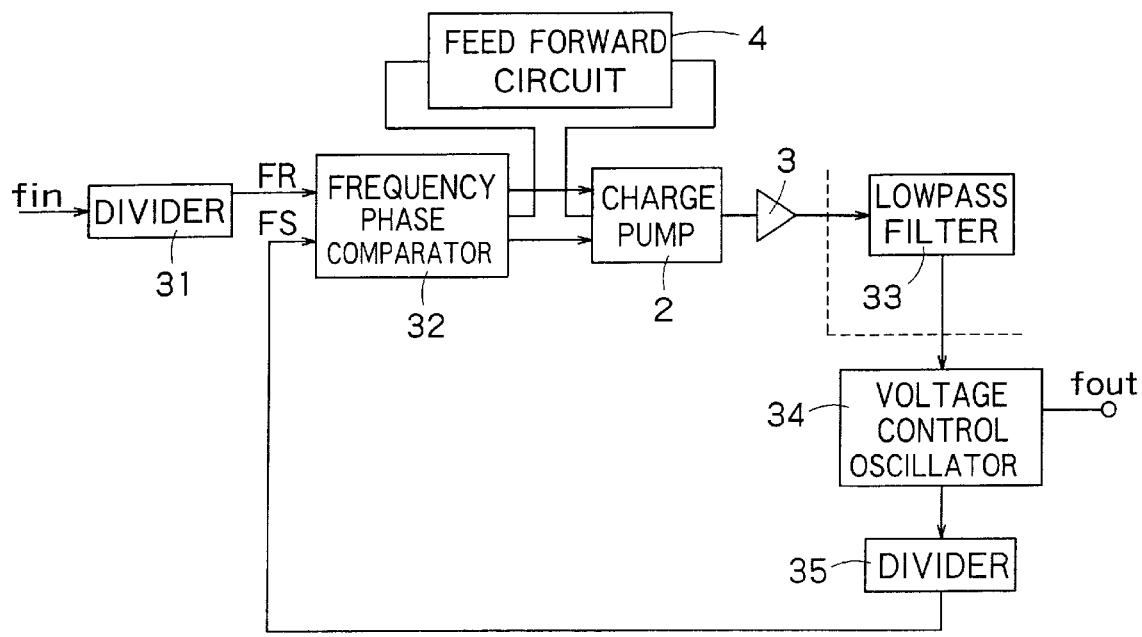
FIG. 7 is a block diagram showing schematic configuration of a frequency synthesizer.

The frequency synthesizer 22 is constituted of a PLL circuit. FIG. 7 is a block diagram showing detailed configuration of the frequency synthesizer 22. As shown in FIG. 7, the frequency synthesizer 22 is provided with a divider (a first divider) 31, a frequency phase comparator 1, a feed forward circuit 4, a charge pump circuit 2 and a current-voltage converting circuit 3 constituted in the same way as FIG. 4 and FIG. 5, a lowpass filter 33, a voltage controlling oscillator 34, and a divider (a second divider) 35.

In FIG. 7, the constituents except for the lowpass filter 33 may be integrated in a single semiconductor chip.

The divider 31 divides the frequency of the oscillating signal of a reference signal oscillator into 1/M (M is an integer equal to or more than 2), and the divider 35 divides the frequency of the output signal of the voltage control oscillator 34 into 1/N (N is an integer equal to or more than 2). The phase comparing circuit outputs a signal in accordance with the differences of the frequency and the phase between the output signal FR of the divider 31 and the output signal FS of the divider 35.

More specifically, when the rising time of the output signal FS of the divider 35 is later than the rising time of the output signal FR of the divider 31, the frequency phase comparing circuit 1 provides the UP signal in accordance with the phase difference of both signals to the charge pump 2. Conversely, when the rising time of the output FR of the divider 31 is later than the rising time of the output signal FS, the frequency phase comparing circuit 1 provides the DOWN signal in accordance with both signals to the charge pump 2.

The voltage control oscillator 34 continues to oscillate with the frequency as it is when the frequency phase comparator 1 does not detect the phase difference. When the frequency phase comparator 1 detects the phase difference, the voltage control oscillator 34 oscillates with the frequency in accordance with the phase difference. In such away, the frequency of the frequency oscillating signal is controlled by PLL in accordance with each divided ratio.

Thus, when the PLL circuit is constituted by using the phase comparing circuit in the first embodiment, even if the phase difference is very small, it is possible to surely perform the frequency control, thereby generating the local oscillating signal in which the jitter component is small and accuracy is high. Accordingly, when the present embodiment is applied to the front-end processor, it is possible to improve the performance of the front-end processor.

Second Embodiment

The second embodiment connects an amplifier to a connecting path between capacitors C1, C2 and the Q outputs of the D flip-flops 11, 12, and cooperatively performs gain adjustment of the amplifier and the current adjustment of a current source in the charge pump 2.

Figure 8:
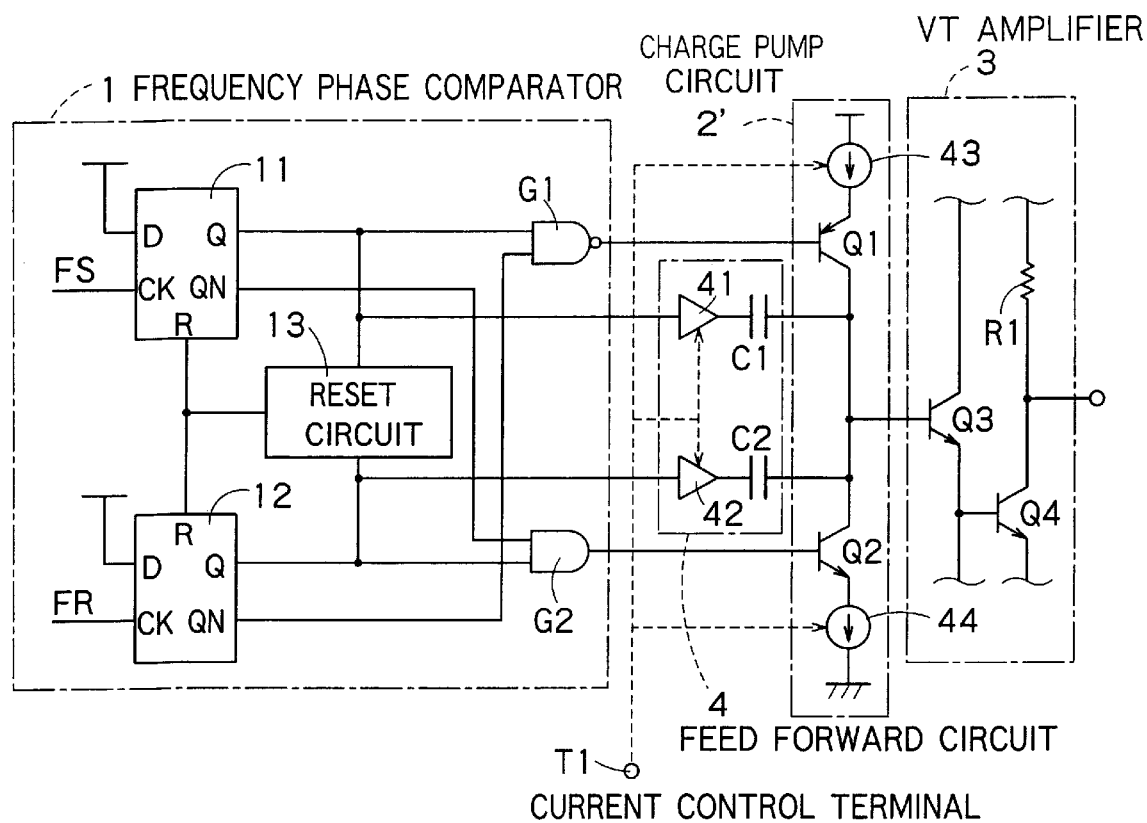
FIG. 8 is a block diagram of a second embodiment of the phase comparing circuit according to the present invention.

FIG. 8 is a block diagram of a second embodiment of the phase comparing circuit according to the present invention. In FIG. 8, the constituents common to that of FIG. 5 are attached the same numbers. Hereinafter, different points will be mainly described.

The feed forward circuit 4 of FIG. 8 has amplifiers (first and second gain adjusting means) 41 and 42 connected to a connection path between the Q output terminals of the D flip-flops 11, 12 and the capacitors C1, C2. Furthermore, the charge pump circuit 2' is provided with the current sources 43 and 44 capable of controlling variably the current passing through the current path.

The gains of the amplifiers 41 and 42 and the current passing through the current sources 43 and 44 are cooperatively controlled by the current control terminal T1. The output terminals of the amplifiers 41 and 42 are connected to one end of the capacitor elements C1 and C2, and the other terminals of the capacitors C1 and C2 are connected to the collector terminals of the transistors Q1 and Q2 in the charge pump circuit 2.

In order to set the loop gain of the PLL circuit, a technique for variably controlling the charge pump current is indispensable. However, if the Dead Zone such as FIG. 3 exists, the sensitivity becomes lower when the phase difference of the input signals FS and FR is very small. When no means are taken, even if increasing the charge pump current, the loop gain does not rise.

Because of this, the circuit of FIG. 8 can variably control the current passing through the charge pump circuit 2', and cooperatively control the gains of the amplifiers 41 and 42. Accordingly, even if the phase difference $\Delta\phi$ of the input signals FS and FR is small, it is possible to heighten the sensitivity of the charge pump 2'.

Figure 9:
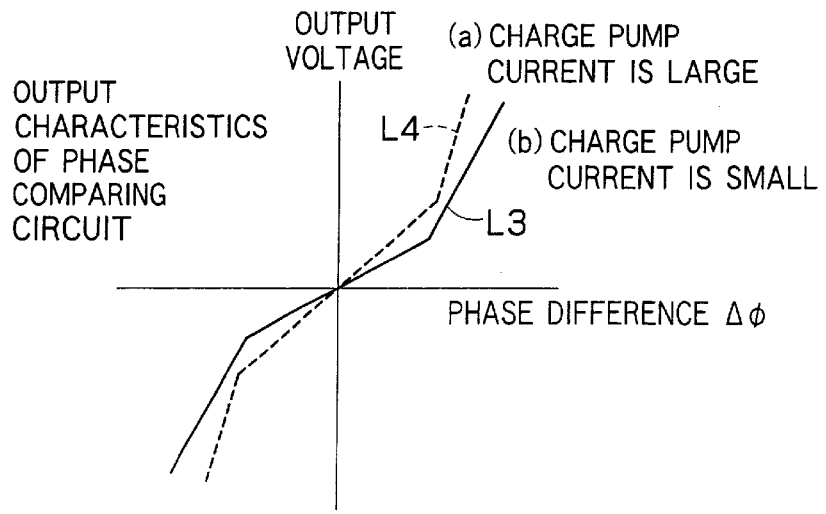
FIG. 9 is an output characteristic diagram of the phase comparing circuit of FIG. 8.

FIG. 9 is an output characteristic diagram of the phase comparing circuit of FIG. 8, and a solid line L3 is a characteristic line in case that the charge pump current is small, and a dotted line is a characteristic line in case that the charge pump current is large. As shown in FIG. 9, by adjusting cooperatively the current passing through the charge pump circuit 2' and the gains of the amplifiers 41 and 42, it is possible to variably control a degree of fluctuation of the output voltage of the current-voltage conversion circuit 3 for the phase difference. Therefore, even if the phase difference of the input signals FS and FR is small, it is possible to heighten the voltage level of the output voltage. That is, the second embodiment can also control sensitivity of the Dead Zone.

Other Embodiment

In the above-mentioned first and second embodiments, an example of connecting any one of the capacitors C1 and C2 to the Q outputs of the D flip-flops 11 and 12, respectively, has been described. However, the number of the capacitors C1 and C2 is not especially limited. The feed forward circuit 4 may be constituted by connecting a plurality of the capacitors C1 and C2 in series or in parallel.

What is claimed is:

1. A phase comparing circuit, comprising:
a phase comparator configured to detect phase difference between first and second input signals;
a charge pump circuit configured to output a signal in accordance with said detected phase difference; and
a feed forward circuit connected between said phase comparator and a first signal transmission path in said charge pump circuit, said feed forward circuit being configured to provide the signal in accordance with said phase difference to said charge pump circuit;
wherein said phase comparator includes:
a second signal transmission path which outputs a signal in sync with said first input signal; and
a third signal transmission path which outputs a signal in sync with said second input signal,
wherein said feed forward circuit includes:
a first capacitor having a first end connected to said second signal transmission path, and a second end connected to said first signal transmission path; and
a second capacitor having a first end connected to said third signal transmission path, and a second end connected to said first signal transmission path.

2. The phase comparing circuit according to claim 1, further comprising a current-voltage converting circuit configured to convert the current passing through the signal transmission path in said charge pump circuit into the voltage.

3. A phase comparing circuit, comprising:
a phase comparator configured to detect phase difference between first and second input signals;
a charge pump circuit configured to output a signal in accordance with said detected phase difference; and
a feed forward circuit connected between said phase comparator and a signal transmission path in said charge pump circuit, said feed forward circuit being configured to provide the signal in accordance with said phase difference to said charge pump circuit;
wherein said feed forward circuit provides the signal in accordance with said phase difference to said charge pump circuit by capacity coupling between a node in said phase comparator and the signal transmission path in said charge pump circuit, and
wherein said phase comparator includes:
a first flip-flop configured to output a signal in sync with a rising edge or a falling edge of said first input signal, and
a second flip-flop configured to output a signal in sync with a rising edge or a falling edge of said second input signal, and
wherein said feed forward circuit includes:
a first capacitor connected between an output terminal of said first flip-flop and the signal transmission path in said charge pump circuit, and
a second capacitor connected between an output terminal of said second flip-flop and the signal transmission path in said charge pump circuit.

4. The phase comparing circuit according to claim 3, further comprising:
a first amplifier connected between the output terminal of said first flip-flop and the first capacitor, said first amplifier being configured to adjust a gain of the output signal of said first flip-flop; and
a second amplifier connected between the output terminal of said second flip-flop and the second capacitor, said second amplifier being configured to adjust a gain of the output signal of said second flip-flop;
wherein said charge pump circuit includes a current source capable of variably controlling the current passing through the signal transmission path; and
wherein said first and second amplifiers adjust the gains by working with the current adjustment of said current source.

5. The phase comparing circuit according to claim 4, further comprising an adjusting terminal configured to cooperatively adjust the amount of the gains of said first and second amplifiers, and the amount of the current in said current source.

6. The phase comparing circuit according to claim 4, wherein said first and second amplifiers, and said current source controls the changing amount of the output of said charge pump circuit for said phase difference.

7. The phase comparing circuit according to claim 3, wherein said phase comparator includes:
a first logic circuit configured to output a pulse in accordance with said phase difference when the phase of said first input signal is later than that of said second input signal; and
a second logic circuit configured to output a pulse in accordance with said phase difference when the phase of said second input signal is later than that of said first input signal;
wherein said charge pump circuit includes:
a first switching element configured to turn on/off in accordance with the output of said first logic circuit; and
a second switching element configured to turn on/off in accordance with the output of said second logic circuit,
and wherein said signal transmission path is provided between said first and second switching elements.

8. The phase comparing circuit according to claim 7, wherein said first logic circuit is a NAND gate in which the output of said first flip-flop and the reversing output of said second flip-flop are inputted,
wherein said second logic circuit is an AND gate in which the reversing output of said first flip-flop and the output of said second flip-flop are inputted.

9. A semiconductor circuit, comprising:
a phase comparator configured to detect phase difference between first and second input signals;
a charge pump circuit configured to output a signal in accordance with said detected phase difference; and
a feed forward circuit connected between said phase comparator and a first signal transmission path in said charge pump circuit, said feed forward circuit being configured to provide the signal in accordance with said phase difference to said charge pump circuit;

wherein said phase comparator includes:
  a second signal transmission path which outputs a signal in sync with said first input signal; and
  a third signal transmission path which outputs a signal in sync with said second input signal,
wherein said feed forward circuit includes:
  a first capacitor having a first end connected to said second signal transmission path, and a second end connected to said first signal transmission path; and
  a second capacitor having a first end connected to said third signal transmission path, and a second end connected to said first signal transmission path.

10. A PLL circuit, comprising:
a phase comparing circuit includes: a phase comparator configured to detect phase difference between first and second input signals, a charge pump circuit configured to output a signal in accordance with said detected phase difference, and a feed forward circuit connected between said phase comparator and a first signal transmission path in said charge pump circuit, said feed forward circuit being configured to provide the signal in accordance with said phase difference to said charge pump circuit;
a voltage control oscillator configured to control oscillating frequency based on the output of said phase comparing circuit; and
a divider configured to provide a signal obtained by dividing the output frequency of said voltage control oscillator to said phase comparing circuit,
wherein said phase comparator includes:
  a second signal transmission path which outputs a signal in sync with said first input signal; and
  a third signal transmission path which outputs a signal in sync with said second input signal,
wherein said feed forward circuit includes:
  a first capacitor having a first end connected to said second signal transmission path, and a second end connected to said first signal transmission path; and
  a second capacitor having a first end connected to said third signal transmission path, and a second end connected to said first signal transmission path.

11. The PLL circuit according to claim 10,
wherein one of said first and second input signals is an output signal of said divider, and the other is a reference frequency signal.

12. A method of comparing phases of a phase comparing circuit which includes: a phase comparator configured to detect phase difference between first and second input signals, a charge pump circuit configured to output a signal in accordance with said detected phase difference; and a feed forward circuit connected between said phase comparator and a first signal transmission path in said charge pump circuit, comprising:
providing a voltage signal in accordance with said phase difference, based on a capacity coupling between said first signal transmission path and a second signal transmission path which outputs a signal in sync with said first input signal, and a capacity coupling between said first signal transmission path and a third signal transmission path which outputs a signal in sync with said second input signal.

13. A PLL circuit, comprising:
a phase comparing circuit includes: a phase comparator configured to detect phase difference between first and second input signals, a charge pump circuit configured to output a signal in accordance with said detected phase difference, and a feed forward circuit connected between said phase comparator and a signal transmission path in said charge pump circuit, said feed forward circuit being configured to provide a signal in accordance with said phase difference to said charge pump circuit;
a voltage control oscillator configured to control oscillating frequency based on the output of said phase comparing circuit; and
a divider configured to provide a signal obtained by dividing the output frequency of said voltage control oscillator to said phase comparing circuit,
wherein said feed forward circuit provides the signal in accordance with said phase difference to said charge pump circuit by capacity coupling between a node in said phase comparator and the signal transmission path in said charge pump circuit, and
wherein said phase comparator includes:
  a first flip-flop configured to output a signal in sync with a rising edge or a falling edge of said first input signal, and
  a second flip-flop configured to output a signal in sync with a rising edge or a falling edge of said second input signal,
and wherein said feed forward circuit includes:
  a first capacitor connected between an output terminal of said first flip-flop and the signal transmission path in said charge pump circuit, and
  a second capacitor connected between an output terminal of said second flip-flop and the signal transmission path in said charge pump circuit.

14. The PLL circuit according to claim 13, further comprising:
a first amplifier connected between the output terminal of said first flip-flop and the first capacitor, said first amplifier being configured to adjust a gain of the output signal of said first flip-flop; and
a second amplifier connected between the output terminal of said second flip-flop and the second capacitor, said second amplifier being configured to adjust a gain of the output signal of said second flip-flop;
wherein said charge pump circuit includes a current source capable of variably controlling the current passing through the signal transmission path; and
wherein said first and second amplifiers adjust the gains by working with the current adjustment of said current source.

15. The PLL circuit according to claim 14, further comprising an adjusting terminal configured to cooperatively adjust the amount of the gains of said first and second amplifiers, and the amount of the current in said current source.

16. The PLL circuit according to claim 14,
wherein said first and second amplifiers, and said current source controls the changing amount of the output of said charge pump circuit for said phase difference.

17. The PLL circuit according to claim 13,
wherein said phase comparator includes:
  a first logic circuit configured to output a pulse in accordance with said phase difference when the phase of said first input signal is later than that of said second input signal; and
  a second logic circuit configured to output a pulse in accordance with said phase difference when the phase of said second input signal is later than that of said first input signal, wherein said charge pump circuit includes:
  a first switching element configured to turn on/off in accordance with the output of said first logic circuit; and
  a second switching element configured to turn on/off in accordance with the output of said second logic circuit;
  and wherein said signal transmission path is provided between said first and second switching elements.

18. The PLL circuit according to claim 17,
wherein said first logic circuit is a NAND gate in which the output of said first flip-flop and the reversing output of said second flip-flop are inputted;
and wherein said second logic circuit is an AND gate in which the reversing output of said first flip-flop and the output of said second flip-flop are inputted.

19. A television broadcasting receiver, comprising:
a bandpass filter configured to filter a signal received at an antenna;
a PLL circuit configured to generate a local oscillating signal;
a mixer configured to convert a frequency of a signal passing through said bandpass filter by using said local oscillating signal;
a base band processor configured to perform signal processing for the frequency-converted signal; and
a control circuit configured to control channel switching,
wherein said PLL circuit comprises:
  a phase comparing circuit including a phase comparator configured to detect phase difference between first and second input signals, a charge pump circuit configured to output a signal in accordance with said detected phase difference, and a feed forward circuit connected between said phase comparator and a signal transmission path in said charge pump circuit, said feed forward circuit being configured to provide a signal in accordance with said phase difference to said charge pump circuit, wherein said feed forward circuit provides the signal in accordance with said phase difference to said charge pump circuit by capacity coupling using at least one capacitor having one end connected to a node in said phase comparator and another end connected to the signal transmission path in said charge pump circuit
  a voltage control oscillator configured to control oscillating frequency based on the output of said phase comparing circuit, and
  a divider configured to provide a signal obtained by dividing the output frequency of said voltage control oscillator to said phase comparing circuit.

* * * * *